US008265301B2

(12) United States Patent
Kimijima et al.

(10) Patent No.: US 8,265,301 B2
(45) Date of Patent: Sep. 11, 2012

(54) AUDIO SIGNAL PROCESSING APPARATUS, AUDIO SIGNAL PROCESSING METHOD, PROGRAM, AND INPUT APPARATUS

(75) Inventors: Tadaaki Kimijima, Kanagawa (JP); Gen Ichimura, Tokyo (JP); Jun Kishigami, Saitama (JP); Masayoshi Noguchi, Chiba (JP); Kazuaki Toba, Kanagawa (JP); Hideya Muraoka, Tokyo (JP)

(73) Assignee: Sony Corporation, Tokyo (JP)

( * ) Notice: Subject to any disclaimer, the term of this patent is extended or adjusted under 35 U.S.C. 154(b) by 1236 days.

(21) Appl. No.: 11/502,156

(22) Filed: Aug. 10, 2006

(65) Prior Publication Data

US 2007/0055497 A1 Mar. 8, 2007

(30) Foreign Application Priority Data

Aug. 31, 2005 (JP) ................................ 2005-251686

(51) Int. Cl.
*H03G 7/00* (2006.01)

(52) U.S. Cl. ........... 381/106; 381/61; 381/119; 381/109

(58) Field of Classification Search .................... 84/630, 84/631, 648, 653, 660–665; 381/61–63, 381/98, 102, 103, 104, 106, 109, 119, 120, 381/118, 27, 307, 302, 303, 310; 704/205–209, 704/214, 225, 258, 268, 269, 275, 278
See application file for complete search history.

(56) References Cited

U.S. PATENT DOCUMENTS 3,825,684 A 7/1974 Ito et al.
4,747,142 A 5/1988 Tofte
4,941,177 A 7/1990 Mandell et al.
5,197,100 A 3/1993 Shitaki
5,305,386 A * 4/1994 Yamato ............................ 381/1
5,386,082 A 1/1995 Higashi
5,537,435 A 7/1996 Carney et al.
5,555,310 A 9/1996 Minami et al.
5,636,283 A 6/1997 Hill et al.
5,742,688 A * 4/1998 Ogawa et al. .................. 381/17
6,078,669 A * 6/2000 Maher ............................ 381/17
6,269,166 B1 * 7/2001 Matsuo et al. ............... 381/310
6,920,223 B1 7/2005 Fosgate
(Continued)

FOREIGN PATENT DOCUMENTS

EP 0593128 A1 4/1994
(Continued)

*Primary Examiner* — Vivian Chin
*Assistant Examiner* — Leshui Zhang
(74) *Attorney, Agent, or Firm* — Wolf, Greenfield & Sacks, P.C.

(57) ABSTRACT

Audio signal processing apparatus is disclosed. The audio signal processing apparatus includes a first audio signal extracting section, a second audio signal extracting section, a sense-of-depth controlling section, a sense-of-sound-expansion controlling section, a control signal generating section, and a mixing section. The first audio signal extracting section extracts a main audio signal. The second audio signal extracting section extracts a sub audio signal. The sense-of-depth controlling section processes the extracted main audio signal to control a sense of depth. The sense-of-sound-expansion controlling section processes the extracted sub audio signal to vary a sense of sound expansion. The control signal generating section generates a first control signal with which the sense-of-depth controlling section is controlled and a second control signal with which the sense-of-sound-expansion controlling section is controlled. The mixing section mixes an output audio signal of the sense-of-depth controlling section and an output audio signal of the sense-of-sound-expansion controlling section.

22 Claims, 9 Drawing Sheets

U.S. PATENT DOCUMENTS

| | | | |
|---|---|---|---|
| 2003/0152236 | A1 | 8/2003 | Morikawa |
| 2005/0169482 | A1 | 8/2005 | Reams et al. |
| 2006/0067541 | A1 | 3/2006 | Yamada et al. |
| 2007/0098181 | A1 | 5/2007 | Noguchi |
| 2007/0110258 | A1 | 5/2007 | Kimijima |
| 2008/0019531 | A1 | 1/2008 | Kimijima |
| 2008/0019533 | A1 | 1/2008 | Noguchi |
| 2008/0130918 | A1 | 6/2008 | Kimijima |

FOREIGN PATENT DOCUMENTS

| | | | | |
|---|---|---|---|---|
| EP | 0608937 | A1 | | 8/1994 |
| GB | 1411408 | A | | 10/1975 |
| JP | 61-081214 | U | | 4/1986 |
| JP | 02-298200 | A | | 12/1990 |
| JP | 03-236691 | A | | 10/1991 |
| JP | 04-249484 | A | | 9/1992 |
| JP | 04-296200 | A | | 10/1992 |
| JP | 05-060096 | | | 8/1993 |
| JP | 08-248070 | A | | 9/1996 |
| JP | 9-172418 | | | 6/1997 |
| JP | 9-200900 | | | 7/1997 |
| JP | 09-511880 | A | | 11/1997 |
| JP | 10-066198 | | | 3/1998 |
| JP | 10-136494 | | | 5/1998 |
| JP | 11-113097 | | | 4/1999 |
| JP | 11-113097 | A | | 4/1999 |
| JP | 2001-007769 | A | | 1/2001 |
| JP | 2001-069597 | A | | 3/2001 |
| JP | 2002-078100 | A | | 3/2002 |
| JP | 2002-95096 | | | 3/2002 |
| JP | 2003-079000 | A | | 3/2003 |
| JP | 2003-516069 | A | | 5/2003 |
| JP | 2003-274492 | A | | 9/2003 |
| JP | 2004-064363 | A | | 2/2004 |
| JP | 2004-135023 | A | | 4/2004 |
| JP | 2004-333592 | A | | 11/2004 |
| JP | 2004333592 | A | * | 11/2004 |
| JP | 2006-014220 | A | | 1/2006 |
| JP | 2006-080708 | A | | 3/2006 |
| WO | WO 99/31938 | A1 | | 6/1999 |

* cited by examiner

AUDIO SIGNAL PROCESSING APPARATUS, AUDIO SIGNAL PROCESSING METHOD, PROGRAM, AND INPUT APPARATUS

CROSS REFERENCES TO RELATED APPLICATIONS

The present invention contains subject matter related to Japanese Patent Application JP 2005-251686 filed in the Japanese Patent Office on Aug. 31, 2005, the entire contents of which being incorporated herein by reference.

BACKGROUND OF THE INVENTION

1. Field of the Invention

The present invention relates to an audio signal processing apparatus, an audio signal processing method, a program, and an input apparatus.

2. Description of the Related Art

Various settings can be performed for multi media devices such as a television receiving device, an Audio Visual (AV) amplifier, and a Digital Versatile Disc (DVD) player. With respect to settings for adjustment of a reproduced sound, a level setting of a sound volume, balance settings of a high frequency band, an intermediate frequency band, and a low frequency band, sound field settings, and so forth can be performed. To accomplish these setting functions, predetermined signal processes are performed for an audio signal.

Patent Document 1 (Japanese Patent Application Unexamined Publication No. HEI 9-200900) describes an invention of an audio signal output circuit which has a plurality of filters having different frequency characteristics and which selectively reproduces an audio signal component having a desired frequency from an input audio signal.

Patent Document 2 (Japanese Patent Application Unexamined Publication No. HEI 11-113097) describes an invention of an audio apparatus which analyzes spectrums of left and right channels, generates waveforms of a front channel and a surrounding channel based on a common spectrum component, and reproduces them so as to obtain a wide acoustic space.

Patent Document 3 (Japanese Patent Application Unexamined Publication No. 2002-95096) describes an invention of a car-equipped acoustic reproducing apparatus which accomplishes an enriched sense of sound expansion and an enriched sense of depth in a limited acoustic space.

SUMMARY OF THE INVENTION

However, the listener may not be satisfied with settings of audio of the related art references. For example, a sound of a sports program contains for example voices of a commentator and a guest who explains a scene and a progress of a game and a sound of presence such as cheering and clapping of audience who are watching the game in the stadium. When a listener listens to a radio sports program, since he or she imagines various scenes from an audio signal which he or she hears, it is preferred that he or she be able to hear a voice of a commentator. In a television broadcast program, since the viewer visually recognizes scenes of sports, it is preferred that he or she be able to hear a sound of cheering and clapping of audience in the stadium because he or she can feel the sense of presence in the stadium.

When the listener wants to clearly hear the voice of the commentator or improve the sense of presence in the stadium, if he or she changes settings of an audio balance and a sound field, the entire audio level is increased. Thus, it is difficult for the listener to change the situation of which he or she is not able to clearly hear the voice of the commentator and change the situation of which there is lack of the sense of presence. Thus, since the voice of the commentator may be disturbed by cheering and clapping of audience in the stadium, the listener may not temporarily understand the scene of the game. In contrast, since the voices of the commentator and guest may disturb the cheering and clapping of audiences in the stadium, the listener may not satisfy the sense of presence in the stadium. Thus, it is preferred that audio signal components contained in an audio signal be set for audio balances and sound fields.

In the related art, when the listener sets audio, it is necessary for him or her to perform a sequence of operations to display a main setting menu on a display unit or the like, switch the main setting menu to an audio setting menu, and then operate a remote control unit or the like for his or her favorite settings. Thus, if the listener feels bothersome for these operations or is not familiar with operating these devices, this operation method is complicated and not user-friendly. In addition, after the listener has set these devices, when he or she reproduces sound, if the settings do not match his or her favorite settings, he or she may have to set them once again. Thus, it is preferred that the listener be able to easily and intuitionally set sound balances and sound fields in real time.

In view of the foregoing, it would be desirable to provide an audio signal processing apparatus, an audio signal processing method, a program, and an input apparatus which allow settings to be performed for predetermined audio signal components contained in an audio signal.

In view of the foregoing, it would be desirable to provide an audio signal processing apparatus, an audio signal processing method, a program, and an input apparatus which allow settings to be easily and intuitionally performed for predetermined audio signal components contained in an audio signal.

According to an embodiment of the present invention, there is provided an audio signal processing apparatus. The audio signal processing apparatus includes a first audio signal extracting section, a second audio signal extracting section, a sense-of-depth controlling section, a sense-of-sound-expansion controlling section, a control signal generating section, and a mixing section. The first audio signal extracting section extracts a main audio signal. The second audio signal extracting section extracts a sub audio signal. The sense-of-depth controlling section processes the extracted main audio signal to control a sense of depth. The sense-of-sound-expansion controlling section processes the extracted sub audio signal to vary a sense of sound expansion. The control signal generating section generates a first control signal with which the sense-of-depth controlling section is controlled and a second control signal with which the sense-of-sound-expansion controlling section is controlled. The mixing section mixes an output audio signal of the sense-of-depth controlling section and an output audio signal of the sense-of-sound-expansion controlling section.

According to an embodiment of the present invention, there is provided an audio signal processing method. A main audio signal is extracted. A sub audio signal is extracted. The extracted main audio signal is processed to control a sense of depth. The extracted sub audio signal is processed to vary a sense of sound expansion. A first control signal used to control the sense of depth and a second control signal used to control the sense of sound expansion are generated. An output audio signal of the sense of depth and an output audio signal of the sense of sound expansion are mixed.

According to an embodiment of the present invention, there is provided a record medium on which a program is recorded. The program causes a computer to execute the following steps. A main audio signal is extracted. A sub audio signal is extracted. The extracted main audio signal is processed to control a sense of depth. The extracted sub audio signal is processed to vary a sense of sound expansion. A first control signal used to control the sense of depth and a second control signal used to control the sense of sound expansion are generated. An output audio signal of the sense of depth and an output audio signal of the sense of sound expansion are mixed.

According to an embodiment of the present invention, there is provided an input apparatus which is operable along at least two axes of a first axis and a second axis. A control signal is generated to control a sense of depth when the input apparatus is operated along the first axis. Another control signal is generated to control a sense of sound expansion when the input apparatus is operated along the second axis.

Other features and advantages of the present invention will be apparent from the following description taken in conjunction with the accompanying drawings, in which like reference characters designate the same or similar parts throughout the figures thereof.

DETAILED DESCRIPTION OF THE PREFERRED EMBODIMENTS

Next, with reference to the accompanying drawings, an embodiment of the present invention will be described. An embodiment of the present invention is applied to a television receiving device.

Figure 1:
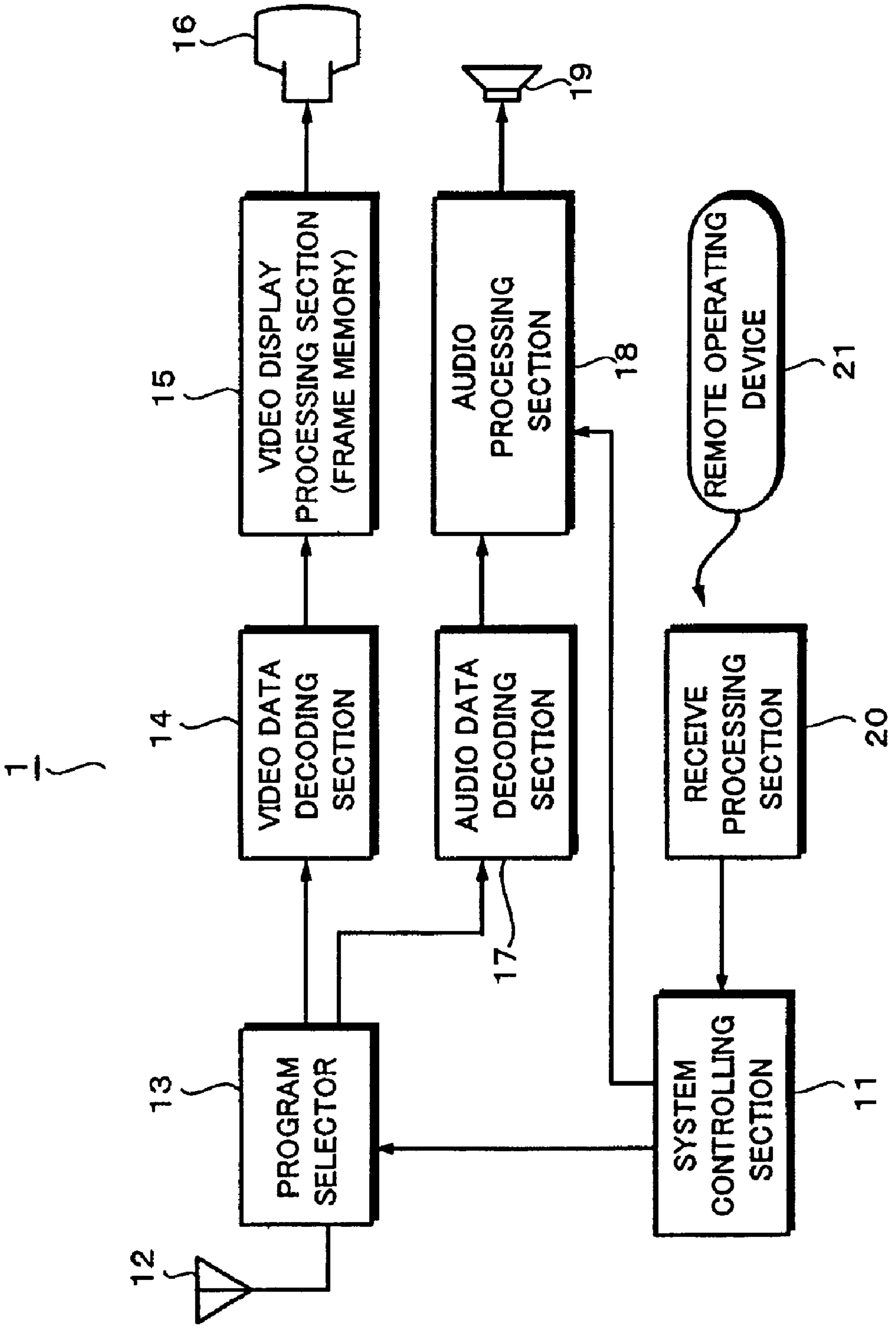
FIG. 1 is a block diagram showing the structure of a television receiving device according to an embodiment of the present invention.

FIG. 1 shows the structure of principal sections of the television receiving device 1 according to an embodiment of the present invention. The television receiving device 1 includes a system controlling section 11, an antenna 12, a program selector 13, a video data decoding section 14, a video display processing section 15, a display unit 16, an audio data decoding section 17, an audio processing section 18, a speaker 19, and a receive processing section 20. Reference numeral 21 denotes a remote operating device for example a remote controlling device which remotely controls the television receiving device 1.

When the television receiving device 1 receives a digital broadcast for example a Broadcasting Satellite (BS) digital broadcast, a Communication Satellite (CS) digital broadcast, or a ground digital broadcast, the individual sections perform the following processes. Next, these processes will be described.

A broadcast wave received by the antenna 12 is supplied to the program selector 13. The program selector 13 performs a demodulating process and an error correcting process. Thereafter, the program selector 13 performs a descrambling process and thereby obtains a transport stream (hereinafter sometimes abbreviated as TS). With reference to a Packet ID (PID), the program selector 13 extracts a video packet and an audio packet of a desired channel from the TS, supplies the video packet to the video data decoding section 14, and the audio packet to the audio data decoding section 17.

The video data decoding section 14 performs a decoding process for video data which have been compression-encoded according to Moving Picture Coding Experts Group (MPEG) standard. When necessary, the video data decoding section 14 performs a format converting process and an interpolating process. The decoded video data are supplied to the video display processing section 15.

The video display processing section 15 is composed of for example a frame memory. Video data supplied from the video data decoding section 14 are written to the frame memory at intervals of a predetermined period. Video data which have been written to the frame memory are read at predetermined timing. When necessary, video data read from the frame memory are converted from digital data into analog data and displayed on the display unit 16. The display unit 16 is for example a Cathode Ray Tube (CRT) display unit or a Liquid Crystal Display (LCD) unit.

On the other hand, with respect to audio data, the audio data decoding section 17 performs a decoding process and so forth. When necessary, the audio data decoding section 17 performs a D/A converting process for audio data. The audio data decoding section 17 outputs an analog or digital audio signal. The output audio signal is supplied to the speaker 19 through the audio processing section 18 which will be described later. The audio signal is reproduced by the speaker 19.

The system controlling section 11 is accomplished by for example a microprocessor. The system controlling section 11 controls the individual sections of the television receiving device 1. The system controlling section 11 controls for example a program selecting process of the program selector 13 and an audio signal process of the audio processing section 18.

The receive processing section 20 receives an operation signal transmitted from the remote operating device 21. The receive processing section 20 demodulates the received operation signal and generates an electric operation signal. The generated operation signal is supplied from the receive processing section 20 to the system controlling section 11. The system controlling section 11 executes a process corresponding to the received operation signal.

The remote operating device 21 is an operating section of for example a remote controlling device. The remote operating device 21 has an input section such as buttons and/or direction keys. The viewer of the television receiving device 1 operates the remote operating device 21 to execute his or her desired function. As will be described later, according to this embodiment, with the operating section, the sense of depth and the sense of sound expansion can be varied.

In the foregoing example, the television receiving device 1 receives a digital broadcast. Instead, the television receiving device 1 may receive an analog broadcast, for example a ground analog broadcast or a BS analog broadcast. According to this embodiment of the present invention, when the television receiving device 1 receives an analog broadcast, a broadcast wave is received by the antenna. An amplifying process is performed by a tuner. A detecting circuit extracts an audio signal from the amplified broadcast wave. The extracted audio signal is supplied to the audio processing section 18. The audio processing section 18 performs a process which will be described later. The processed signal is reproduced from the speaker 19.

Next, the audio processing section 18, which is a feature of this embodiment of the present invention, will be described. The audio processing section 18 extracts a main audio signal component and a sub audio signal component from the input audio signal and performs signal processes for the extracted signal components. The main audio signal component and the sub audio signal component are for example a voice of a human and other sounds; a voice of a commentator and a surrounding sound of presence such as cheering and clapping of audience in a stadium for a sports program; a sound of an instrument played by a main performer and sounds of instruments played by other performers in a concert; and a vocal of a singer and a background sound. Thus, the main audio signal component and the sub audio signal component are different from those used in a multiplex broadcasting system. In the following description, it is assumed that the main audio signal component is voices of an announcer, a commentator, and so forth, whereas the sub audio signal component is a sound of presence such as cheering, clapping, and so forth.

Figure 2:
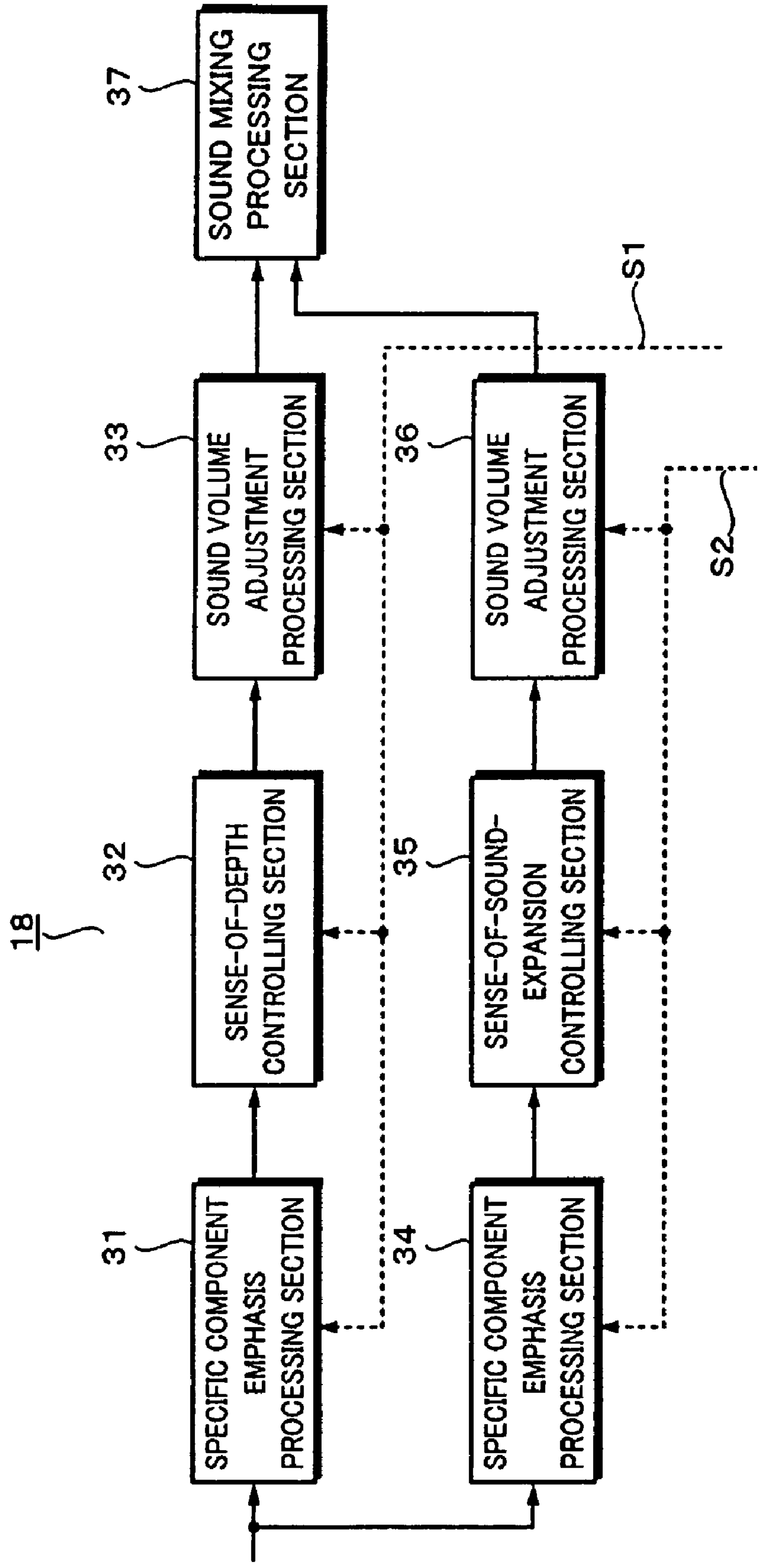
FIG. 2 is a block diagram showing the structure of an audio processing section of the television receiving unit according to the embodiment of the present invention.

FIG. 2 shows an example of the structure of the audio processing section 18 according to this embodiment of the present invention. The audio processing section 18 includes a specific component emphasis processing section 31, a sense-of-depth controlling section 32, a sound volume adjustment processing section 33, a specific component emphasis processing section 34, a sense-of-sound-expansion controlling section 35, a sound volume adjustment processing section 36, and a sound mixing processing section 37.

The specific component emphasis processing section 31 is composed of for example a filter which passes an audio signal component having a specific frequency band of an input audio signal. The specific component emphasis processing section 31 extracts an audio signal component having a desired frequency band from the input audio signal. In this example, since the desired audio signal component is voices of a commentator and so forth, the frequencies of a voice of a human ranging from around 200 Hz to around 3500 Hz, the specific component emphasis processing section 31 extracts an audio signal component having this frequency band from the input audio signal. The extracted audio signal component is supplied to the sense-of-depth controlling section 32. The process of extracting an audio signal component may be performed using a voice canceller technology, which is used in for example a Karaoke device. In other words, only an audio signal component having a frequency band for cheering and clapping is extracted. The difference between the extracted audio signal component and a Left (L) channel signal component and the difference between the extracted audio signal component and a Right (R) channel signal component may be obtained. The other audio signal component may be kept as it is.

Generally, voices of an announcer, a commentator, and so forth may be present at the center of a sound. Thus, when audio signals supplied to the audio processing section 18 are multiple-channel audio signals of two or more channels, the levels of the audio signals of the L channel and the R channel are monitored. When their levels are the same, the audio signals are present at the center. Thus, when audio signals present at the center are extracted, voices of humans can be extracted.

The sense-of-depth controlling section 32 is composed of for example an equalizer. The sense-of-depth controlling section 32 varies a frequency characteristic of an input audio signal. It is known that a voice of a human is the vibration of vocal cords and the frequency band of the voice generated by the vocal cords has a simple spectrum structure. An envelop curve of the spectrum has a crest and a trough. A peak portion of the envelop curve is referred to as a formant. The corresponding frequency is referred to as a formant frequency. It is said that a male voice has a plurality of formants in a frequency band ranging from 250 Hz to 3000 Hz and a female voice has a plurality of formants in a frequency band ranging from 250 Hz to 4000 Hz. The formant at the lowest frequency is referred to as the first formant, the format at the next lowest frequency as the second formant, the formant at the third lowest frequency as the third formant, and so forth.

The sense-of-depth controlling section 32 adjusts the band widths and levels of the formant frequencies, which are emphasis components and concentrate at specific frequency ranges, so as to vary the sense of depth. In addition, the sense-of-depth controlling section 32 can divide the audio signal supplied to the sense-of-depth controlling section 32 into audio signal components having for example a low frequency band, an intermediate frequency band, and a high frequency band, cuts off (or attenuates) the audio signal component having the high frequency band so that the sense of depth decreases (namely, the listener feels as if the sound is close to him or her) or cuts off (or attenuates) the audio signal component having the low frequency band so that the sense of depth increases (namely, the listener feels as if the sound is apart from him or her).

An audio signal which has been processed in the sense-of-depth controlling section 32 is supplied to the sound volume adjustment processing section 33. The sound volume adjustment processing section 33 varies the sound volume of the audio signal to vary the sense of depth. To decrease the sense of depth, the sound volume adjustment processing section 33 increases sound volume of the audio signal. To increase the sense of depth, the sound volume adjustment processing section 33 decreases the sound volume of the audio signal. An audio signal which is output from the sound volume adjustment processing section 33 is supplied to the sound mixing processing section 37.

The specific component emphasis processing section 31, the sense-of-depth controlling section 32, and the sound volume adjustment processing section 33 are controlled corresponding to a sense-of-depth control signal S1 which is a first control signal which is supplied from the system controlling section 11. According to this embodiment, the sense-of-depth controlling section 32 varies the frequency characteristic of the audio signal, whereas the sound volume adjustment processing section 33 varies the sound volume of the audio signal. Instead, the sense of depth may be varied by the process of the sense-of-depth controlling section 32 or the process of the audio volume adjustment processing section 33.

On the other hand, the audio signal supplied to the audio processing section 18 is also supplied to the specific component emphasis processing section 34. The specific component emphasis processing section 34 extracts an audio signal component having a frequency band of cheering and clapping from the input audio signal. Instead, rather than passing an input signal component having a specific frequency band, the specific component emphasis processing section 34 may obtain the difference between the audio signal supplied to the specific component emphasis processing section 34 and the audio signal component extracted by the specific component emphasis processing section 31 to extract the audio signal component of cheering and clapping.

The audio signal component which is output from the specific component emphasis processing section 34 is supplied to the sense-of-sound-expansion controlling section 35. The sense-of-sound-expansion controlling section 35 processes the audio signal component to vary the sense of sound expansion. When audio signals of two channels are supplied to the sense-of-sound-expansion controlling section 35, it performs a matrix decoding process for the audio signals to generate multi-channel audio signals of for example 5.1 channels. When speakers which reproduce audio signals support 5.1 channels, multi-channel audio signals of 5.1 channels are output from the sense-of-sound-expansion controlling section 35. When speakers which reproduce audio signals of two channels of L and R channels, the sense-of-sound-expansion controlling section 35 may perform a virtual surround process for the audio signals.

When audio signals for which the virtual surround process have been performed are reproduced, the viewer can have a three-dimensional stereophonic sound effect with two channels of L and R speakers disposed at his or her front left and right positions as if a sound is also generated from a direction other than directions of the speakers. Many other methods of accomplishing a virtual surround effect have been proposed. For example, a head related transfer function from the L and R speakers to both ears of the viewer is obtained. Matrix calculations are performed for audio signals which are output from the L and R speakers using the head related transfer function. This virtual surround process allows audio signals of 5.1 channels to be output as audio signals of two channels. When audio signals are reproduced by the L and R speakers disposed at viewer's front left and right positions, a sound image can be fixed at a predetermined position around him or her. As a result, the viewer can feel the sense of sound expansion.

The sense-of-sound-expansion controlling section 35 may use a known technology of controlling the sense of sound expansion described in the foregoing second and third related art references besides the matrix decoding process and the virtual surround process.

An audio signal which is output from the sense-of-sound-expansion controlling section 35 is supplied to the sound volume adjustment processing section 36. The sound volume adjustment processing section 36 adjusts the sound volume of the audio signal which has been processed for the sense of sound expansion. When the sense-of-sound-expansion controlling section 35 has emphasized the sense of sound expansion, the sound volume adjustment processing section 36 increases the sound volume. In contrast, when the sense-of-sound-expansion controlling section 35 has restored the emphasized sense of sound expansion to the default state, the sound volume adjustment processing section 36 decreases the sound volume. Only the sense-of-sound-expansion controlling section 35 may control the sense of sound expansion while the audio volume adjustment processing section 36 does not adjust the sound volume. An audio signal which is output from the sound volume adjustment processing section 36 is supplied to the sound mixing processing section 37.

When the sound volume adjustment processing section 33 has increased the sound volume, the sound volume adjustment processing section 36 may increase the sound volume. In contrast, when the sound volume adjustment processing section 33 has increased the sound volume, the sound volume adjustment processing section 36 may decrease the sound volume so that the audio volume adjustment processing section 33 and the audio volume adjustment processing section 36 complementarily operate. When the audio volume adjustment processing section 33 and the audio volume adjustment processing section 36 complementarily operate, only the sense of depth and the sense of sound expansion may be varied without necessity of increasing or decreasing the sound volume of the entire audio signal.

The specific component emphasis processing section 34, the sense-of-sound-expansion controlling section 35, and the sound volume adjustment processing section 36 are controlled corresponding to a sense-of-audio-expansion control signal S2 which is a second control signal supplied from the system controlling section 11.

The sound mixing processing section 37 mixes the output audio signal of the sound volume adjustment processing section 33 and the output audio signal of the sound volume adjustment processing section 36. An audio signal generated by the sound mixing processing section 37 is supplied to the speaker 19. The speaker 19 reproduces the audio signal. The audio processing section 18 can vary the sense of depth and the sense of sound expansion. For example, when the sense-of-depth controlling section 32 is controlled to decrease the sense of depth, the voice of the commentator can be more clearly reproduced. When the sense-of-sound-expansion controlling section 35 is controlled to emphasize the sense of sound expansion, a sound image of for example cheering and clapping in a stadium can be fixed around the viewer. Thus, the viewer can feel like he or she is present in the stadium.

Next, an input apparatus which generates the sense-of-depth control signal S1 and the sense-of-sound-expansion control signal S2 will be described. In the following description, it is assumed that the input apparatus is disposed in the remote operating device 21. Instead, the input apparatus may be disposed in the main body of the television receiving device 1.

Figure 3:
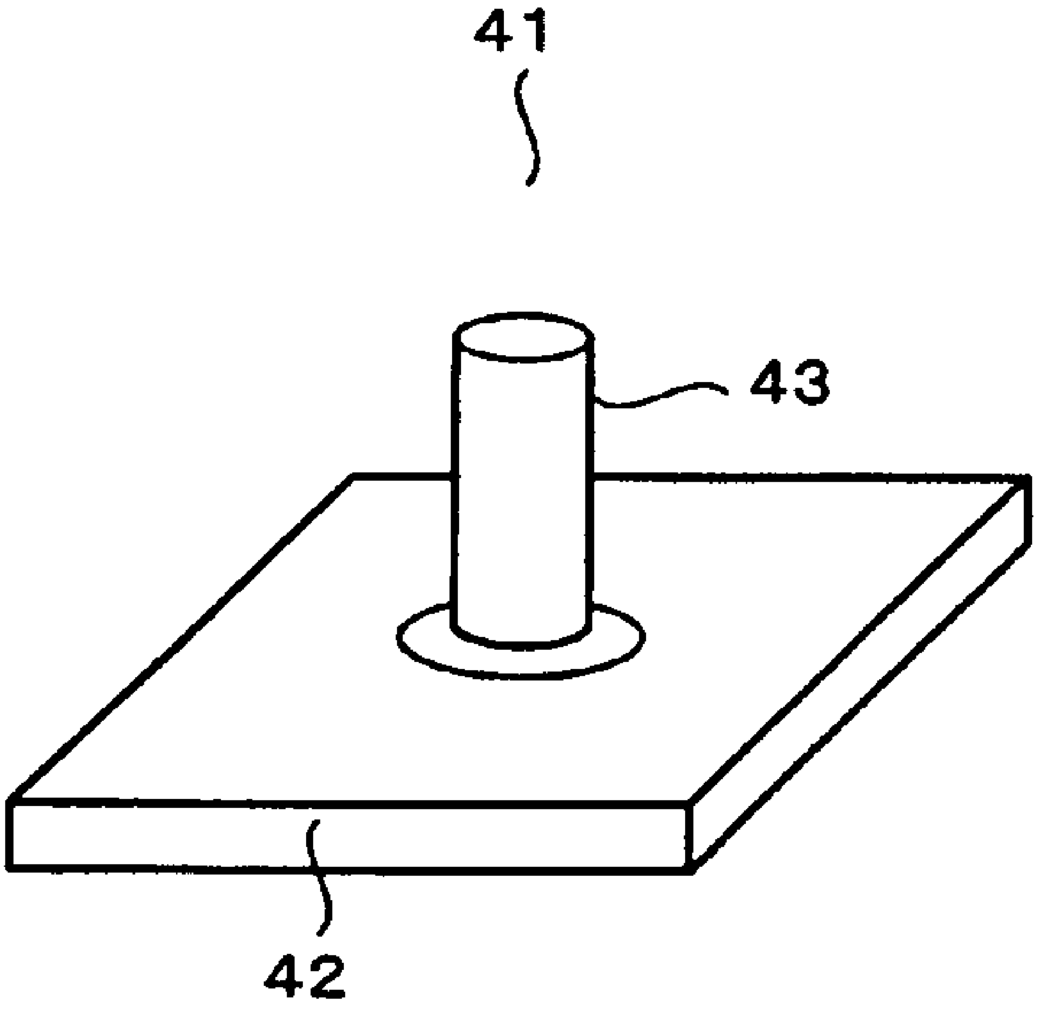
FIG. 3 is an external view showing the appearance of an input apparatus according to an embodiment of the present invention.

FIG. 3 shows an appearance of an input apparatus 41 according to an embodiment of the present invention. The input apparatus 41 has a support member 42 and a stick 43 supported by the support member 42. The stick 43 can be operated along two axes of vertical and horizontal axes. With respect to the vertical axis, the stick 43 can be inclined on the far side and the near side of the user. On the other hand, with respect to the horizontal axis, the stick 43 can be inclined on the right and on the left of the user.

Figure 4A:
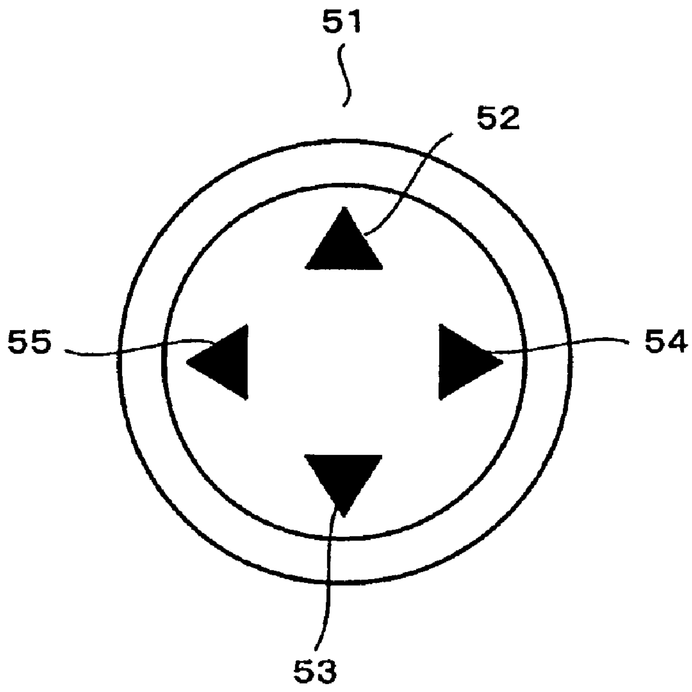
FIG. 4A and FIG. 4B are schematic diagrams showing other examples of the input apparatus according to the embodiment of the present invention.
Figure 4B:
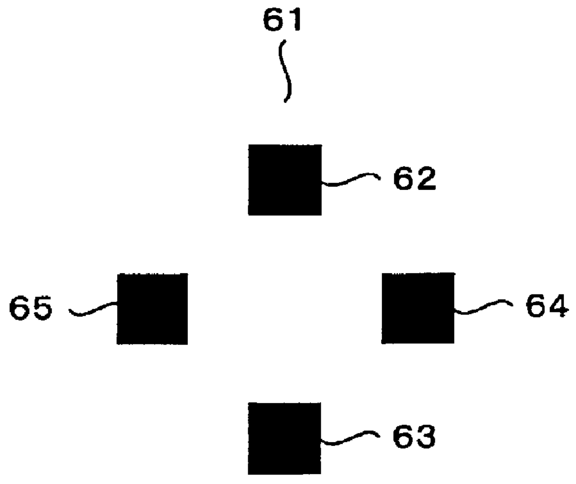

FIG. 4A and FIG. 4B show examples of modifications of the input apparatus. The input apparatus is not limited to a stick-shaped device. Instead, the input apparatus may be buttons or keys. An input apparatus 51 shown in FIG. 4A has direction keys disposed in upper, lower, left, and right directions. The input apparatus 51 has an up key 52 and a down key 53 in the vertical directions and a right key 54 and a left key 55 in the horizontal directions. When the input apparatus 51 is operated, the up key 52 or the down key 53 is pressed along the vertical axis or the right key 54 or the left key 55 along the horizontal axis.

Instead of the direction keys, as shown in FIG. 4B, an input apparatus 61 may have buttons 62, 63, 64, and 65. The buttons 61 and 63 are disposed along the vertical directions, while the buttons 64 and 65 are disposed along the horizontal directions.

Figure 5:
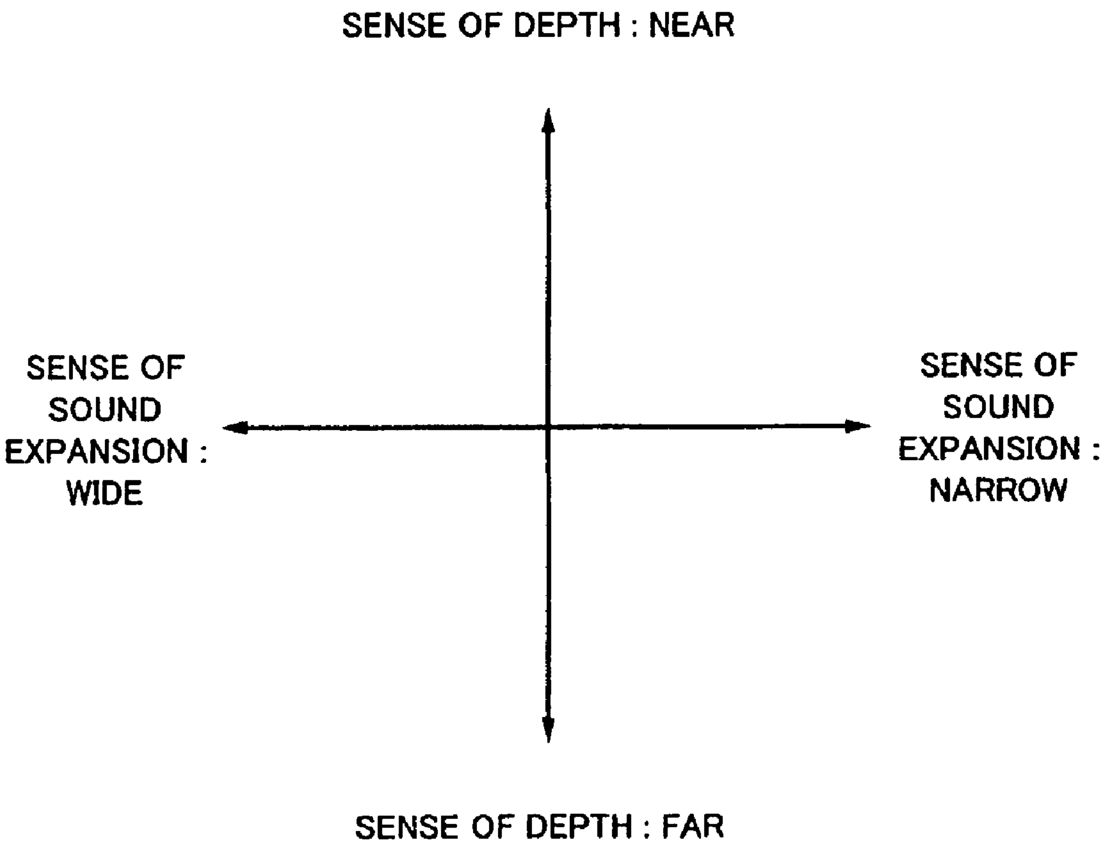
FIG. 5 is a schematic diagram showing the relationship of control amounts and operation directions of the input apparatus according to the embodiment of the present invention.

Next, an example of an operation of the input apparatus which can be operated along the two axes will be described. FIG. 5 shows an example of control amounts which can be varied corresponding to operations of the input apparatus 41. When the input apparatus 41 according to this embodiment of the present invention is operated along the vertical axis, the sense of depth can be controlled. When the input apparatus 41 is operated along the horizontal axis, the sense of sound expansion can be controlled. Assuming that a point at intersection of the two axes is designated as a default value of the television receiving device 1, when the stick 43 is inclined in the up direction along the vertical axis, the sense of depth can be decreased. When the stick 43 is inclined in the down direction along the vertical axis, the sense of depth can be increased. When the stick 43 is inclined in the left direction along the horizontal axis, the sense of sound expansion can be emphasized. When the stick 43 is inclined in the right direction along the horizontal axis, the sense of sound expansion can be restored to the original state. With respect to the sense of sound expansion, when the stick 43 is inclined in any of the left direction and the right direction, the sense of sound expansion may be emphasized.

In other words, when the input apparatus 41 disposed on the remote operating device 21 is operated along the vertical axis, the remote operating device 21 generates the sense-of-depth control signal S1, which controls the sense of depth. When the stick 43 is operated in the up direction along the vertical axis, the sense-of-depth control signal S1 causes the sense of depth to be decreased. When the stick 43 is operated in the down direction along the vertical axis, the sense-of-depth control signal S1 causes the sense of depth to be increased.

For example, a modulating process is performed for the sense-of-depth control signal S1. The resultant sense-of-depth control signal S1 is sent to the television receiving device 1. The receive processing section 20 of the television receiving device 1 receives the sense-of-depth control signal S1, performs for example a demodulating process for the signal, and then supplies the processed signal to the system controlling section 11.

The system controlling section 11 sends the sense-of-depth control signal S1 to the specific component emphasis processing section 31, the sense-of-depth controlling section 32, and the sound volume adjustment processing section 33 of the audio processing section 18. The specific component emphasis processing section 31, the sense-of-depth controlling section 32, and the sound volume adjustment processing section 33 decrease or increase the sense of depth corresponding to the sense-of-depth control signal S1.

On the other hand, when the input apparatus 41 is operated along the horizontal axis, the remote operating device 21 generates the sense-of-sound-expansion control signal S2 which controls the sense of sound expansion. When the stick 43 is operated in for example the left direction along the horizontal axis, the sense-of-sound-expansion control signal S2 causes the sense of sound expansion to be emphasized. When the stick 43 is operated in for example the right direction along the horizontal axis, the sense-of-sound-expansion control signal S2 causes the sense of sound expansion to be restored to the original state.

For example, a modulating process is performed for the generated sense-of-sound-expansion control signal S2. The resultant sense-of-sound-expansion control signal S2 is sent to the television receiving device 1. The receive processing section 20 of the television receiving device 1 receives the sense-of-sound-expansion control signal S2, performs for example a demodulating process for the signal, and supplies the processed signal to the system controlling section 11. The system controlling section 11 supplies the sense-of-sound-expansion control signal S2 to the specific component emphasis processing section 34, the sense-of-sound-expansion controlling section 35, and the sound volume adjustment processing section 36. The specific component emphasis processing section 34, the sense-of-sound-expansion controlling section 35, and the sound volume adjustment processing section 36 emphasize the sense of sound expansion or restore the emphasized sense of sound expansion to the original state corresponding to the sense-of-sound-expansion control signal S2.

Thus, when only the stick 43 disposed on the input apparatus 41 is operated along the two axes, the sense of depth and the sense of sound expansion can be varied. As a result, the desired sense of depth and the desired sense of sound expansion can be accomplished by easy and intuitional operations using the stick 43 rather than complicated operations on menu screens using various keys.

If the user has an interest in audio and is familiar with the field of audio, he or she can obtain his or her desired sense of depth and sense of sound expansion with proper operations of the input apparatus 41. Otherwise, it may be difficult for the user to obtain his or her desired sense of depth and sense of sound expansion with operations of the input apparatus 41. Thus, it is preferred to indicate how the sense of depth and the sense of sound expansion are varying corresponding to operations of the input apparatus 41.

Figure 6:
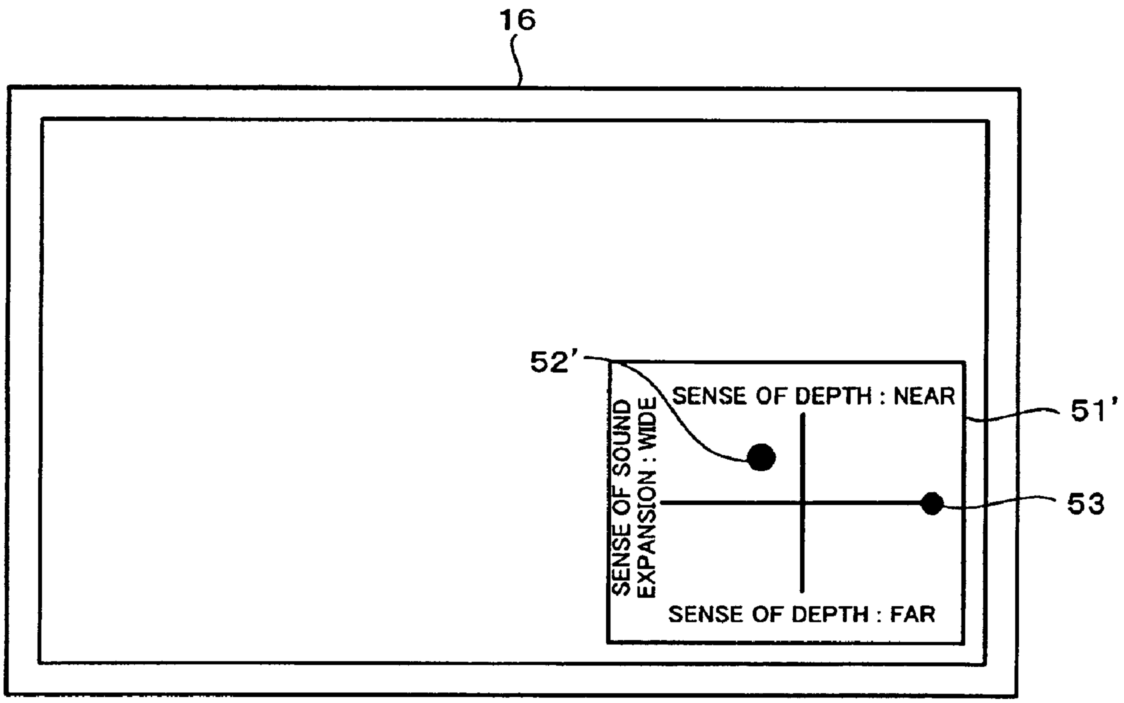
FIG. 6 is a schematic diagram showing a state indication according to the embodiment of the present invention.

FIG. 6 shows an example of a state indication displayed at a part of the display space of the display unit 16. A state indication 51' indicates the vertical axis with respect to information about the sense of depth and the horizontal axis with respect to information about the sense of sound expansion corresponding to the two axes of the input apparatus 41. In addition, the state indication 51' indicates a cursor button 52' which moves upward, downward, leftward, and rightward corresponding to the operations of the input apparatus 41.

The cursor button 52' has a default position (which is the rightmost position on the horizontal axis). The default position is denoted by reference numeral 53. The cursor button 52' is moved as the input apparatus 41 is operated. When the stick 43 of the input apparatus 41 is inclined on for example the far side of the user, the cursor button 52' moves in the up direction on the state indication 51'. When the stick 43 is inclined in the near side of the user, the cursor button 52' moves in the down direction of the input apparatus 51. When the stick 43 is inclined on the left of the user, the cursor button 52' moves in the left direction on the state indication 51'. When the stick 43 is inclined on the right of the user, the cursor button 52' moves in the right direction on the state indication 51'.

With the state indication 51', the user can acoustically and visually recognize how the sense of depth and the sense of sound expansion are varying from the default position. Thus, even if the user is not familiar with the field of audio, he or she can recognize how the sense of depth and the sense of sound expansion are varying. When the user memorizes the position of the cursor button 52' as his or her favorite sense of depth and sense of sound expansion, he or she can use the position as a clue for which he or she can set them when he or she watches a program of the same category.

Data of the state indication 51' are generated by for example the system controlling section 11. The system controlling section 11 generates indication data of the state indication 51' (hereinafter sometimes referred to as state indication data) with the sense-of-depth control signal S1 and the sense-of-sound-expansion control signal S2 received by the receive processing section 20. The generated state indication data are supplied to an On Screen Display (OSD) section (not shown). The OSD section superimpose video data which are output from the video display processing section 15 with the state indication data. The superimposed data are displayed on the display unit 16.

Figure 7:
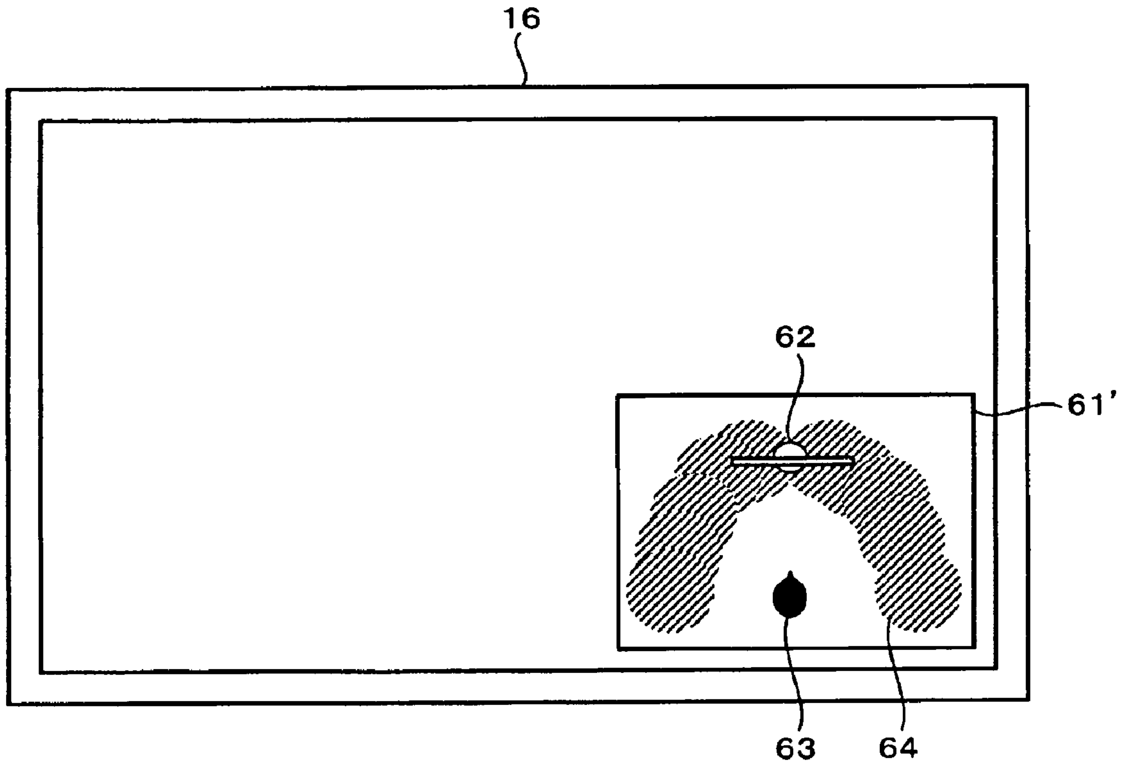
FIG. 7 is a schematic diagram showing another example of a state indication according to the embodiment of the present invention.

FIG. 7 shows another example of the state indication. A state indication 61' more simply indicates the sense of sound expansion. The state indication 61' indicates for example a viewer mark 63 and a television receiving device mark 62. In addition, the state indication 61' indicates a region 64 of sound expansion around the viewer mark 63. When the stick 43 is inclined in the left direction, the region 64 in the state indication 61' widens. When the stick 43 is inclined in the right direction, the region 64 narrows. Instead, the state indication 51' and the state indication 61' may be selectively displayed.

Figure 8:
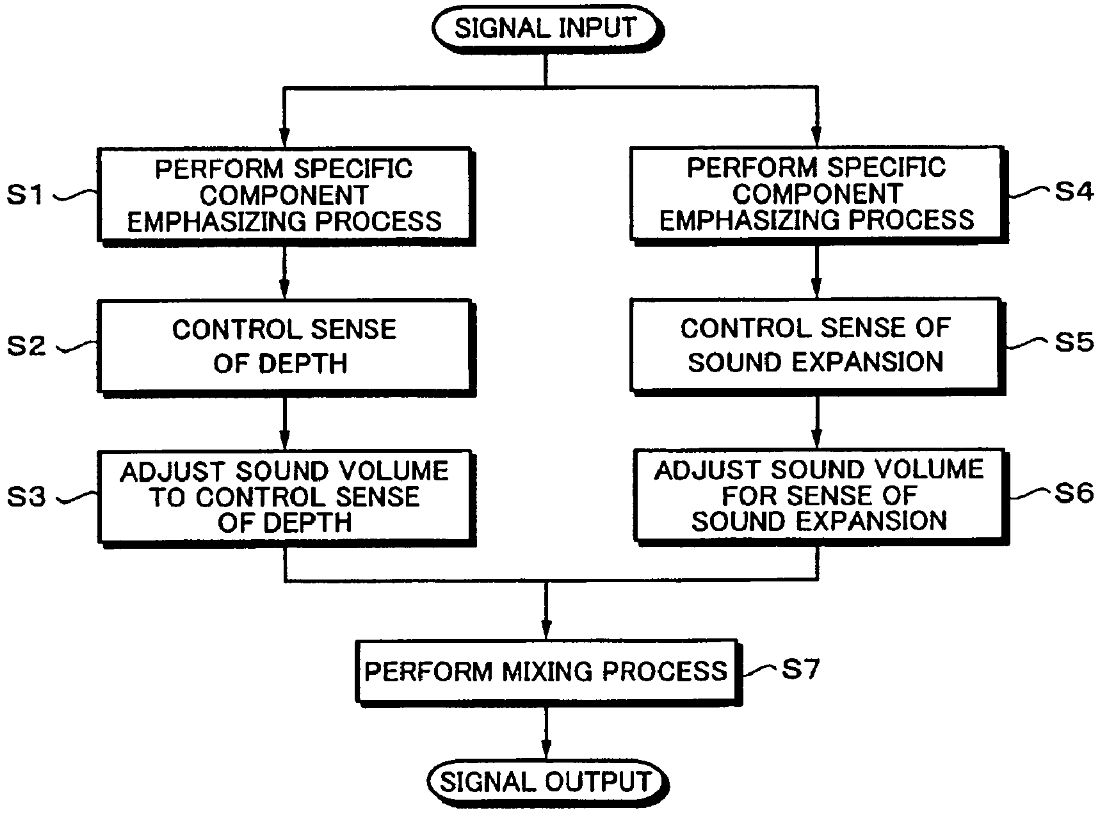
FIG. 8 is a flow chart showing a process performed in the audio processing section according to the embodiment of the present invention.

FIG. 8 is a flow chart showing an example of a process performed by the audio processing section 18 of the television receiving device 1. This process may be performed by hardware or software which uses a program.

When an audio signal is input to the audio processing section 18, the flow advances to step S1. At step S1, the specific component emphasis processing section 31 extracts an audio signal component having a frequency band of a voice of a human such as a commentator from the input audio signal. Thereafter, the flow advances to step S2.

At step S2, the sense-of-depth controlling section 32 controls the sense of depth corresponding to the sense-of-depth control signal S1 supplied from the system controlling section 11. The sense-of-depth controlling section 32 adjusts the level of an audio signal component having a predetermined frequency band with for example an equalizer. Instead, the sense-of-depth controlling section 32 may divide the audio signal into a plurality of signal components having different frequency bands and independently adjust the levels of the signal components having the different frequency bands. Thereafter, the flow advances to step S3.

At step S3, the sound volume adjustment processing section 33 adjusts the sound volume to control the sense of depth. To decrease the sense of depth, the audio volume adjustment processing section 33 increases the sound volume. To increase the sense of depth, the audio volume adjustment processing section 33 decreases the sound volume. The sense of depth may be controlled by one of the processes performed at step S2 and step S3.

While the sense of depth is being controlled from step S1 to step S3, the sense of sound expansion is controlled from step S4 to step S6.

At step S4, the specific component emphasis processing section 34 extracts an audio signal component having a frequency band for cheering and clapping from the input audio signal. Thereafter, the flow advances to step S5.

At step S5, the sense-of-sound-expansion controlling section 35 varies the sense of expansion. To vary the sense of sound expansion, as described above, the sense-of-sound-expansion controlling section 35 converts audio signals of two channels of L and R channels into audio signals of multi channels (5.1 channels or the like) by for example the matrix decoding process. Thereafter, the flow advances to step S6.

At step S6, the sound volume adjustment processing section 36 adjusts the sound volume. When the sense of sound expansion has been emphasized at step S5, the audio volume adjustment processing section 36 increase the sound volume at step S6. When the emphasized sense of sound expansion has been restored to the original state at step S5, the audio volume adjustment processing section 36 decreases the sound volume at step S5.

After the process at step S3 or the process at step S6 has been completed, the flow advances to step S7. At step S7, the sound mixing processing section 37 mixes (synthesizes) the audio signal for which the sense of depth has been controlled and the audio signal for which the sense of sound expansion has been controlled. The mixed (synthesized) audio signal is output.

Figure 9:
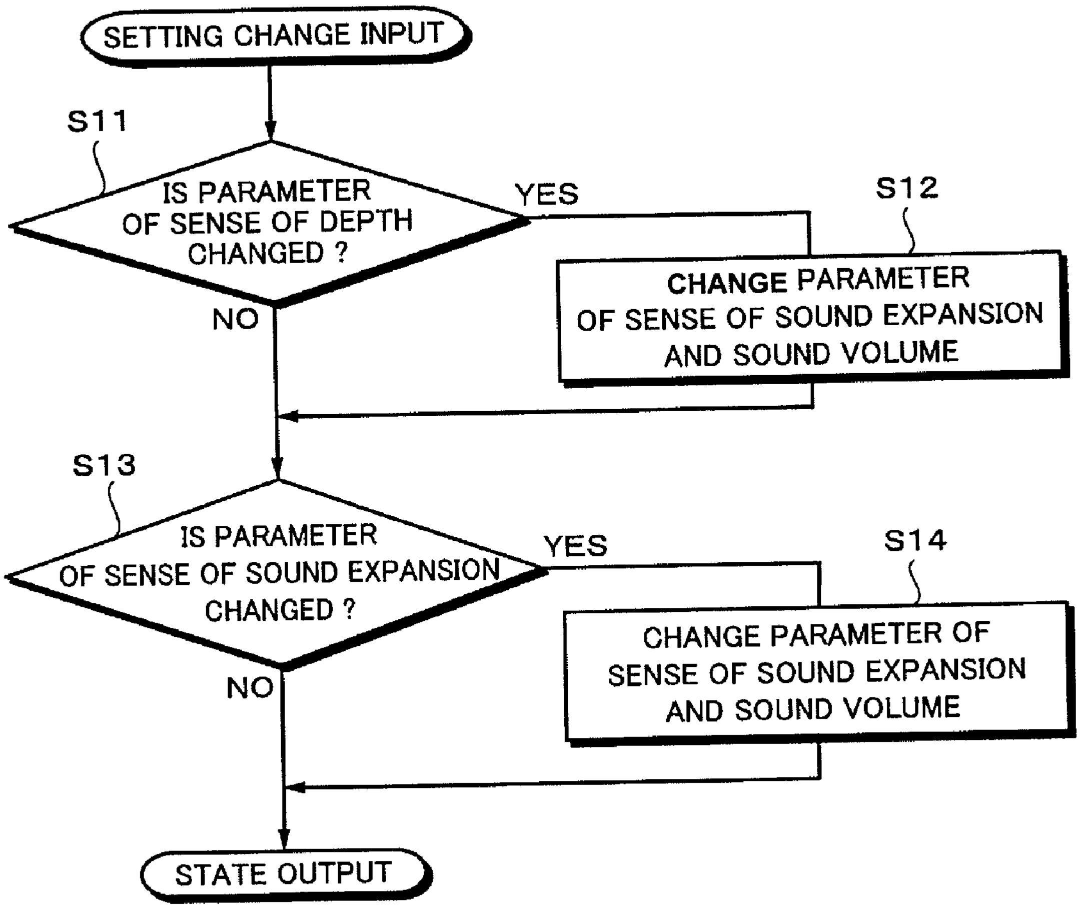
FIG. 9 is a flow chart describing settings of parameters used in the process of the audio processing section according to the embodiment of the present invention.

FIG. 9 is a flow chart showing an example of a control method of operations of the input apparatus. The following processes are executed by for example the system controlling section 11.

At step S11, it is determined whether to change a parameter of the sense of depth. The parameter of the sense of depth is a variable with which the sense of depth is controlled to be increased or decreased. In the input apparatus 41 shown in FIG. 3, when the stick 43 is operated along the vertical axis, the parameter of the sense of depth is changed. When the parameter of the sense of depth is changed, the flow advances to step S12.

At step S12, the parameter of the sense of depth is changed. The parameter of the sense of depth is designated corresponding to the time period, the number of times, and so forth for which the stick 43 is inclined along the vertical axis.

When the determined result at step S11 is No or after the parameter of the sense of depth has been changed at step S12, the flow advances to step S13.

At step S13, it is determined whether to change the parameter of the sense of sound expansion. The parameter of the sense of sound expansion is a variable with which the sense of sound expansion is controlled to be emphasized or restored to the original state. When the stick 43 is operated along the horizontal axis, the parameter of the sense of sound expansion is changed. When the parameter of the sense of sound expansion has been changed, the flow advances to step S14.

At step S14, the parameter of the sense of sound expansion is changed. The parameter of the sense of sound expansion is designated corresponding to the time period, the number of times, and so forth for which the stick 43 is inclined along the horizontal axis.

When the determined result at step S13 is No or after the parameter of the sense of sound expansion has been changed at step S14, the parameter of the sense of depth and the parameter of the sense of sound expansion are output.

It should be understood by those skilled in the art that various modifications, combinations, sub-combinations and alternations may occur depending on design requirements and other factors insofar as they are within the scope of the appended claims or the equivalents thereof. In the foregoing embodiment, when the stick 43 of the input apparatus 41 is inclined, the sense of depth or the sense of sound expansion is continuously varied. Instead, they may be stepwise varied. The default setting of the stick 43 may be designated as 0. When the stick 43 is inclined on the far side of the user, the sense of depth may be decreased as +1. When the stick 43 is inclined on the near side of the user, the sense of depth may be increased as −1. In such a manner, the sense of depth and the sense of sound expansion may be quantitatively controlled.

In addition, viewer's favorite sense of depth and sense of sound expansion for each of categories of television programs such as baseball games, football games, news, concerts, and variety programs may be stored. In this case, when the viewer watches a television program of one of these categories, it is not necessary for him or her to set his or her favorite sense of depth and sense of sound expansion.

The foregoing embodiment is applied to a television receiving device. Instead, an embodiment of the present invention may be applied to devices which has a sound output function, for example a tuner, a radio broadcast receiving device, a portable music player, a DVD recorder, and a Hard Disk Drive (HDD) recorder as well as a television receiving device. In addition, an embodiment of the present invention may be applied to a personal computer which can receive a television broadcast, a broad band broadcast distributed through the Internet, or an Internet radio broadcast. When an embodiment of the present invention is applied to a personal computer, a pointing device such as a mouse or a scratch pad and an input keyboard may be used as an input apparatus.

The foregoing processing functions may be accomplished by a personal computer which uses a program. The program which describes code for processes may be recoded on a record medium for example a magnetic recording device, an optical disc, a magneto-optical disc, a semiconductor memory, or the like from which the computer can read the program.

What is claimed is:

1. An audio signal processing apparatus for an audio reproduction system, comprising:

a first audio signal extracting section configured to extract a main audio signal from an input audio signal, wherein the main audio signal is representative of a first recorded localized source of sound in the input audio signal;

a second audio signal extracting section configured to extract a sub audio signal from the input audio signal, wherein the sub audio signal is representative of sounds in the input audio signal from multiple sources other than the source of the main audio signal;

a sense-of-depth controlling section configured to process the extracted main audio signal to control a sense of depth;

a sense-of-depth volume adjustment controller configured to adjust a volume parameter of signals associated with the sense-of-depth controlling section;

a sense-of-sound-expansion controlling section configured to process the extracted sub audio signal to vary a sense of spatial sound expansion when the sub audio signal is reproduced by the audio reproduction system;

a sense-of-sound-expansion volume adjustment controller configured to adjust a volume parameter of signals associated with the sense-of-sound-expansion controlling section;

a control signal generating section configured to generate a first control signal with which the sense-of-depth controlling section is controlled and a second control signal with which the sense-of-sound-expansion controlling section is controlled; and a mixing section configured to mix an output audio signal of the sense-of-depth controlling section and an output audio signal of the sense-of-sound-expansion controlling section, wherein the sense-of-depth volume adjustment section and the sense-of-sound-expansion volume adjustment section are configured to adjust the volume parameters of respective signals complementarily.

2. The apparatus of claim 1, wherein the sub audio signal originates from multiple locations other than the location of the main audio signal.

3. The apparatus of claim 1, wherein the sense-of-depth controlling section adjusts band widths and levels of formant frequencies.

4. The audio signal processing apparatus as set forth in claim 1, wherein the control signal generating section further comprises a controller operable along at least a first axis and a second axis, wherein a first control signal is generated when the controller is operated along the first axis, and a second control signal is generated when the controller is operated along the second axis.

5. The audio signal processing apparatus as set forth in claim 4, wherein the controller is configured to be operated by a user and the first axis corresponds to a sense-of-depth axis and the second axis corresponds to a sense-of-sound-expansion axis.

6. The audio signal processing apparatus as set forth in claim 4, wherein the first control signal affects a sense of depth of sound reproduced by the audio reproduction system.

7. The audio signal processing apparatus as set forth in claim 4, wherein the second control signal affects a sense of sound expansion of sound reproduced by the audio reproduction system.

8. The audio signal processing apparatus as set forth in claim 4, wherein the control signal generating section is further configured to provide display data to a display device representative of operation of the controller.

9. The audio signal processing apparatus as set forth in claim 8, wherein the display data is representative of orthogonal axes.

10. The audio signal processing apparatus as set forth in claim 8, wherein the display data is representative of a listener in a variable sound expansion field.

11. The audio signal processing apparatus as set forth in claim 1, wherein the audio reproduction system comprises a television.

12. A method for processing audio signals for an audio reproduction system, comprising:

extracting, by a first audio signal extracting section, a main audio signal from an input audio signal, wherein the main audio signal is representative of a first recorded localized source of sound in the input audio signal;

extracting, by a second audio signal extracting section, a sub audio signal from the input audio signal, wherein the sub audio signal is representative of sounds in the input audio signal from multiple sources other than the source of the main audio signal;

processing, by a sense-of-depth controlling section, the extracted main audio signal to control a sense of depth;

adjusting, by a sense-of-depth volume adjustment section, a volume parameter of signals associated with the sense-of-depth controlling section;

processing, by a sense-of-sound-expansion controlling section, the extracted sub audio signal to vary a sense of spatial sound expansion when the sub audio signal is reproduced by the audio reproduction system;

adjusting, by a sense-of-sound-expansion volume adjustment section, a volume parameter of signals associated with the sense-of-sound-expansion controlling section;

generating, by a control signal generating section, a first control signal with which the sense-of-depth controlling section is controlled and a second control signal with which the sense-of-sound-expansion controlling section is controlled; and mixing, by a mixing section, an output audio signal of the sense-of-depth controlling section and an output audio signal of the sense-of-sound-expansion controlling section, wherein the sense-of-depth volume adjustment section and the sense-of-sound-expansion volume adjustment section adjust the volume parameters of respective signals complementarily.

13. The method of claim 12, further comprising adjusting, by the sense-of-depth controlling section, bandwidths and levels of formant frequencies.

14. The method of claim 12, wherein the acts of adjusting are responsive to user input received by the control signal generating section from a controller operable along at least two axes.

15. The method of claim 14, wherein operation of the controller along a first axis generates a first signal that affects a sense of depth of sound reproduced by the audio reproduction system.

16. The method of claim 14, wherein operation of the controller along a second axis generates a second signal that affects a sense of sound expansion of sound reproduced by the audio reproduction system.

17. The method of claim 14, further comprising providing display data to a display device representative of operation of the controller.

18. The method of claim 17, wherein the display data is representative of orthogonal axes.

19. The method of claim 17, wherein the display data is representative of a listener in a variable sound expansion field.

20. The method of claim 12, wherein the audio reproduction system comprises a television.

21. A non-transitory recording medium on which a program is recorded, the program causing a processor to execute acts of:

extracting, by a first audio signal extracting section, a main audio signal from an input audio signal, wherein the main audio signal is representative of a first recorded localized source of sound in the input audio signal;

extracting, by a second audio signal extracting section, a sub audio signal from the input audio signal, wherein the sub audio signal is representative of sounds in the input audio signal from multiple sources other than the source of the main audio signal;

processing, by a sense-of-depth controlling section, the extracted main audio signal to control a sense of depth;

adjusting, by a sense-of-depth volume adjustment section, a volume parameter of signals associated with the sense-of-depth controlling section;

processing, by a sense-of-sound-expansion controlling section, the extracted sub audio signal to vary a sense of spatial sound expansion when the sub audio signal is reproduced by the audio reproduction system;

adjusting, by a sense-of-sound-expansion volume adjustment section, a volume parameter of signals associated with the sense-of-sound-expansion controlling section;

generating, by a control signal generating section, a first control signal with which the sense-of-depth controlling section is controlled and a second control signal with which the sense-of-sound-expansion controlling section is controlled; and mixing, by a mixing section, an output audio signal of the sense-of-depth controlling section and an output audio signal of the sense-of-sound-expansion controlling section, wherein the sense-of-depth volume adjustment section and the sense-of-sound-expansion volume adjustment section adjust the volume parameters of respective signals complementarily.

22. The non-transitory recording medium of claim 21, wherein the audio reproduction system comprises a television.

* * * * *